(12) United States Patent
Van Denend

(10) Patent No.: US 7,284,484 B2
(45) Date of Patent: Oct. 23, 2007

(54) LASER ABLATING OF PRINTING PLATES AND/OR PRINTING ROLLERS TO DECREASE TAPER AND TIR

(76) Inventor: Mark E. Van Denend, 349 E. 36th St., Paterson, NJ (US) 07504

(*) Notice: Subject to any disclaimer, the term of this patent is extended or adjusted under 35 U.S.C. 154(b) by 49 days.

(21) Appl. No.: 11/143,163

(22) Filed: Jun. 2, 2005

(65) Prior Publication Data

US 2006/0272529 A1 Dec. 7, 2006

(51) Int. Cl.
*B41N 3/00* (2006.01)

(52) U.S. Cl. .................................... 101/467; 101/463.1

(58) Field of Classification Search ............ 101/463.1, 101/467, 401.1, 128.4, 129, 487, 483; 430/300–308
See application file for complete search history.

(56) References Cited

U.S. PATENT DOCUMENTS

| | | | |
|---|---|---|---|
| 3,549,733 A | 12/1970 | Caddell | |
| 4,733,049 A | 3/1988 | Lemelson | |
| 4,777,769 A | 10/1988 | McLaughlin et al. | |
| 4,864,777 A | 9/1989 | McLaughlin et al. | |
| 4,901,417 A | 2/1990 | Chupka et al. | |
| 5,052,292 A * | 10/1991 | Lewis et al. | 101/142 |
| 5,198,636 A | 3/1993 | Suchan | |
| 5,327,167 A * | 7/1994 | Pollard et al. | 358/3.3 |
| 5,386,097 A | 1/1995 | Ruckl | |
| 5,605,097 A | 2/1997 | Ruckl et al. | |
| 5,654,125 A * | 8/1997 | Fan et al. | 430/306 |
| 5,804,353 A | 9/1998 | Cushner et al. | |
| 5,836,248 A * | 11/1998 | Jarrold et al. | 101/453 |
| 5,916,403 A | 6/1999 | Cushner et al. | |
| 6,025,921 A | 2/2000 | Beckett et al. | |
| 6,159,659 A | 12/2000 | Gelbart | |
| 6,171,758 B1 | 1/2001 | Bhateja et al. | |
| 6,178,852 B1 | 1/2001 | Pfaff | |
| 6,551,759 B2 | 4/2003 | Daems et al. | |
| 6,551,762 B1 | 4/2003 | Gaignou et al. | |
| 6,605,410 B2 | 8/2003 | Yang et al. | |
| 6,627,385 B2 | 9/2003 | Hiller et al. | |
| 6,696,221 B1 * | 2/2004 | McLean et al. | 430/306 |
| 6,703,095 B2 * | 3/2004 | Busshoff et al. | 428/36.91 |
| 6,737,216 B2 | 5/2004 | Kannurpatti et al. | |
| 6,756,181 B2 | 6/2004 | Yang et al. | |
| 6,776,095 B2 | 8/2004 | Telser et al. | |
| 6,793,562 B2 | 9/2004 | Gunjima et al. | |
| 6,794,115 B2 | 9/2004 | Telser et al. | |
| 6,797,455 B2 | 9/2004 | Hiller et al. | |

(Continued)

*Primary Examiner*—Anthony H. Nguyen
(74) *Attorney, Agent, or Firm*—Richard M. Goldberg

(57) ABSTRACT

Apparatus for reducing variations in total indicated run-out and taper in a printing roller, includes a detector which detects variations in total indicated run-out and taper in a surface of the printing roller, and a laser which ablates the surface of the printing roller. A control device controls the laser to ablate the surface in a manner to reduce variations in the total indicated run-out and taper in the printing roller, in response to the detector, while there is relative rotation and lengthwise movement between the printing roller and the laser and detector. Also, a printing plate is mounted on the printing roller, and the control device controls the laser to reduce the total indicated run-out and taper by further ablating a surface of the printing plate. The control device further controls the laser to etch an image into the printing plate.

49 Claims, 6 Drawing Sheets

U.S. PATENT DOCUMENTS

| | | |
|---|---|---|
| 6,806,018 B2 | 10/2004 | Kanga et al. |
| 6,822,669 B2 | 11/2004 | Fischer et al. |
| 6,844,142 B2 | 1/2005 | Schadebrodt et al. |
| 6,985,261 B2 * | 1/2006 | Klein et al. ............... 358/3.26 |

* cited by examiner

LASER ABLATING OF PRINTING PLATES AND/OR PRINTING ROLLERS TO DECREASE TAPER AND TIR

BACKGROUND OF THE INVENTION

The present invention relates generally to printing plates mounted on cylindrical rollers in a printing press, and more particularly, is directed to an apparatus and method for laser ablating of printing plates and/or printing rollers to decrease variations in TIR and/or TAPER thereof in order to ensure cylindricity thereof.

It is well-known to use printing plates mounted on printing rollers in a printing operation. The printing rollers can include one or more sleeves and/or other layers thereon. The printing plates are etched or engraved in accordance with a desired image in order to effect the printing operation. It is also known to provide such etching or engraving of the image on the printing plate by means of a laser.

However, a problem with such known arrangements is that the raised surface of the printing plate, when mounted on the printing roller, is not adequately cylindrical. In other words, apart from the etched portions, there are variations in the radii at different positions of the raised surface of the printing plate, measured from the center of the printing roller to the raised surface of the printing plate, thereby providing variations in the cylindricity thereof.

These variations in cylindricity affect the print quality. Specifically, it is important that a good impression be provided to obtain a high grade print during a fast flexographic printing operation. However, tolerances in the printing roller and/or the printing plate cause variations in the cylindricity. In other words, these tolerances result in a lack of adequate cylindricity. In order to compensate for the same during a printing operation, it is necessary to provide greater pressure or impression of the printing roller and printing plate during a printing operation. However, in regions of the printing roller and printing plate having a greater radius than other regions, this results in various problems, such as general squeegeeing of the image, printing plate speed mismatch and a resultant general lower quality print.

It is therefore desirable that the outer surface of the printing plate mounted on the printing roller have a cylindricity without these high and low spots.

In this regard, there are two measurements that determine the cylindrical nature or cylindricity of the printing roller and/or printing plate. The first measurement is TIR (Total Indicated Run-out), which determines the circular nature of the cylindrical printing plate at one point during a single revolution of the printing plate. The second measurement is TAPER, which determines if there are any variations in the radius from end to end of the printing roller and/or printing plate, that is, in the lengthwise direction thereof.

Conventionally, in order to obtain a cylindrical outer surface without variations in TIR and/or TAPER, a grinding wheel has been used to mechanically grind the outer surface of the printing roller and/or printing plate to make the outer surface cylindrical. However, this is burdensome, costly and time consuming.

SUMMARY OF THE INVENTION

Accordingly, it is an object of the present invention to provide an apparatus and method for laser ablating of printing rollers and/or printing plates that overcomes the aforementioned problems.

It is another object of the present invention to provide an apparatus and method for laser ablating of printing rollers and/or printing plates thereon to decrease variations in TIR and/or TAPER thereof in order to ensure cylindricity thereof.

It is still another object of the present invention to provide an apparatus and method for laser ablating of printing rollers and/or printing plates thereon to decrease variations in TIR and/or TAPER thereof in order to ensure cylindricity thereof, while simultaneously etching an image into the printing plate.

It is yet another object of the present invention to provide an apparatus and method for laser ablating of printing rollers and/or printing plates that is relatively inexpensive and easy to use and manufacture.

It is a further object of the present invention to provide an apparatus and method for laser ablating of printing rollers including any surface and material of the printing roller itself or supported on the printing roller.

In accordance with an aspect of the present invention, apparatus for reducing variations in at least one of total indicated run-out and taper in a printing roller, includes a detector which detects variations in at least one of total indicated run-out and taper in a surface of the printing roller, and a laser which ablates the surface of the printing roller. A control device connected with the detector and the laser controls the laser to ablate the surface in a manner to reduce variations in the at least one of total indicated run-out and taper in the printing roller, in response to the detector.

The detector includes a source of rays from the electromagnetic spectrum projected onto the surface and a sensor that detects the rays that are reflected off of the surface. In a preferred embodiment, the source of rays includes a laser.

A first driving device rotates the printing roller to expose different portions of the surface to the detector and the laser, and a second driving device provides relative movement in a lengthwise direction between the printing roller and at least one of the laser and the detector.

In one embodiment, the printing roller includes a cylindrical roller, and the control device controls the laser to reduce at least one of total indicated run-out and taper by ablating a surface of the cylindrical roller. In this embodiment, the control device further controls the laser to etch an image into the cylindrical roller.

In another embodiment, the printing roller includes a cylindrical roller and a sleeve mounted on the cylindrical roller, and the control device controls the laser to reduce at least one of total indicated run-out and taper by ablating a surface of the sleeve.

In addition, and preferably, a printing plate is mounted on the printing roller, and the control device controls the laser to reduce at least one of total indicated run-out and taper by further ablating a surface of the printing plate. The control device further controls the laser to etch an image into the printing plate.

In accordance with another aspect of the present invention, apparatus for reducing variations in at least one of total indicated run-out and taper in a printing plate mounted on a printing roller, includes a detector which detects variations in at least one of total indicated run-out and taper in a surface of the printing plate, and a laser which ablates the surface of the printing plate. A control device connected with the detector and the laser controls the laser to ablate the surface in a manner to reduce variations in the at least one of total indicated run-out and taper in the printing plate, in response to the detector.

The control device further controls the laser to etch an image into the printing plate.

In accordance with still another aspect of the present invention, a method for reducing variations in at least one of total indicated run-out and taper in a printing roller, includes the steps of detecting variations in at least one of total indicated run-out and taper in a surface of the printing roller, and determining portions of the surface of the printing roller to be ablated to reduce variations in the at least one of total indicated run-out and taper in the printing roller, in response to the step of detecting. The determined portions of the surface of the printing roller are then laser ablated in order to reduce variations in the at least one of total indicated run-out and taper thereof.

The step of detecting includes the step of projecting a source of rays from the electromagnetic spectrum onto the surface and a sensor that detects the rays that are reflected off of the surface. The source of rays preferably includes a laser.

The printing roller is rotated to expose different portions of the surface during the steps of detecting and laser ablating, and relative movement in a lengthwise direction between the printing roller and at least one of the laser and the detector is also provided.

In one embodiment, the printing roller includes a cylindrical roller, and the step of laser ablating includes the step of reducing at least one of total indicated run-out and taper by ablating a surface of the cylindrical roller. In such case, there is the further step of laser ablating an image into the cylindrical roller.

In another embodiment, the printing roller includes a cylindrical roller and a sleeve mounted on the cylindrical roller, and the step of laser ablating includes the step of reducing at least one of total indicated run-out and taper by ablating a surface of the sleeve. Further, a printing plate is mounted on the printing roller; and the method further includes the step of reducing at least one of total indicated run-out and taper by further ablating a surface of the printing plate. In such case, there is also laser ablating of an image into the printing plate.

In accordance with yet another aspect of the present invention, a method for reducing variations in at least one of total indicated run-out and taper in a printing plate mounted on a printing roller, includes the steps of detecting variations in at least one of total indicated run-out and taper in a surface of the printing plate, and determining portions of the surface of the printing plate to be ablated to reduce variations in the at least one of total indicated run-out and taper in the printing plate, in response to the step of detecting. The determined portions of the surface of the printing plate are then laser ablated in order to reduce variations in the at least one of total indicated run-out and taper thereof.

There is also the step of laser ablating an image into the printing plate. The steps of laser ablating the determined portions and laser ablating an image can be simultaneously performed.

The above and other objects, features and advantages of the invention will become readily apparent from the following detailed description thereof which is to be read in connection with the accompanying drawings.

DETAILED DESCRIPTION

Figure 1:
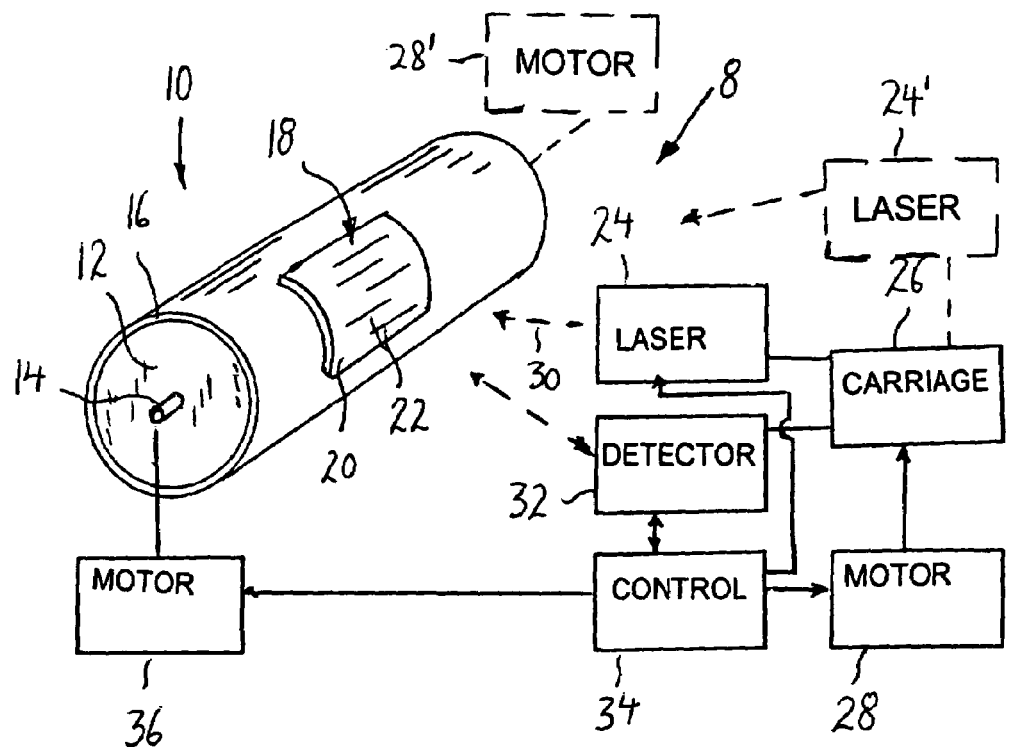
FIG. 1 is perspective view and block diagram of apparatus according to one embodiment of the present invention.
Figure 2:
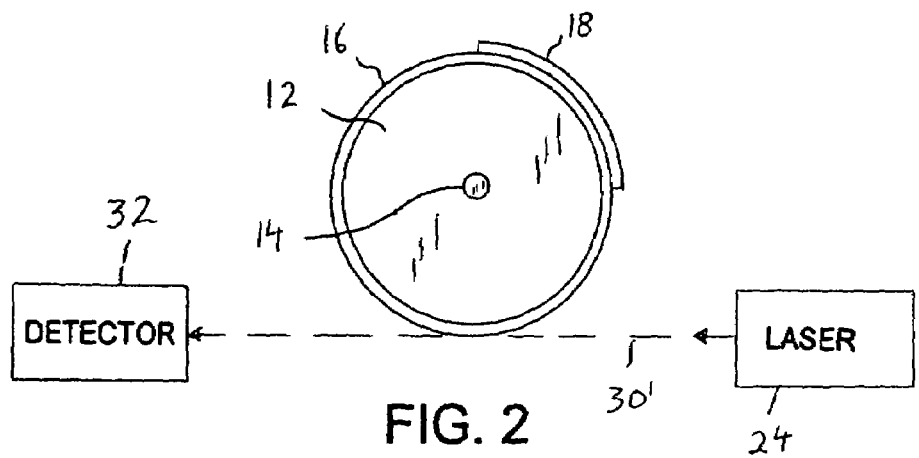
FIG. 2 is an end elevational view of the printing roller and printing plate of FIG. 1.

Referring to the drawings in detail, and initially to FIGS. 1 and 2 thereof, a printing roller 10 for a printing press, such as a flexographic printing press, includes a cylindrical roller 12 mounted on a shaft 14. Printing roller 12 further includes an annular sleeve 16 mounted on cylindrical roller 12. Preferably, sleeve 16 extends completely around the entire circumference of cylindrical roller 12. A printing plate 18 is mounted on an outer surface of sleeve 16. Printing plate 18 will be engraved in order to produce an image during a printing operation, as is well known in the art.

Because cylindrical roller 12, sleeve 16 and/or printing plate 18 according to the present invention will be laser ablated in the various embodiments to be described hereafter, they are preferably made of materials that permit such laser ablating, including but not limited to any flexible substrate made from a photopolymer, vulcanized rubber, a thermal polymer, or any other suitable material, and including but not limited to the materials discussed in U.S. Pat. Nos. 5,804,353; 6,551,759; 6,551,762; 6,159,659; 6,627,385; 6,776,095; 6,794,115; 6,737,216; 6,178,852; and 6,797,455, the entire disclosures of which are incorporated herein by reference. Alternatively, cylindrical roller 12 and/or sleeve 16 can be a metal sleeve which is coated with any one or more of the above materials.

As discussed above, a problem with such arrangement is that the raised surface 20 of printing plate 18, when positioned on sleeve 16, is not adequately cylindrical, that is, there are high and low spots on the outer raised surface of printing plate 18. This can be caused by various factors, such as different thicknesses or tolerances of printing plate 18 and/or sleeve 16, or even from raised portions of different radii on the outer surface of cylindrical roll 12 on which sleeve 16 and printing plate 18 are mounted.

Figure 3:
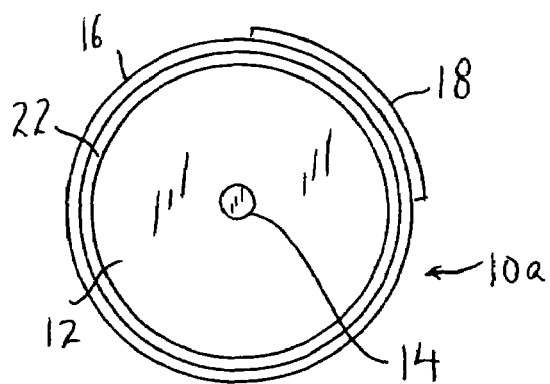
FIG. 3 is an end elevational view of a different printing roller and printing plate that can be used with the present invention.

Alternatively, as shown in FIG. 3, a built-up sleeve 22 can be provided on cylindrical roller 12 of a printing roller 10a, with annular sleeve 16 mounted thereon, followed by printing plate 18 mounted on annular sleeve 16.

Figure 4:
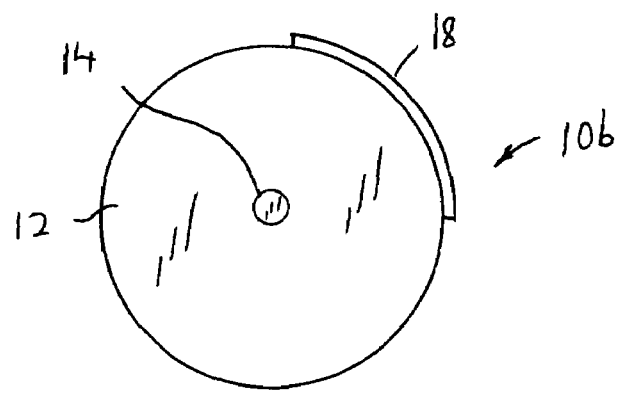
FIG. 4 is an end elevational view of a still different printing roller and printing plate that can be used with the present invention.

As a further modification, as shown in FIG. 4, sleeves 16 and 22 can be eliminated from printing roller 10b, and printing plate 18 can be mounted directly on the outer surface of cylindrical roller 12.

Figure 5:
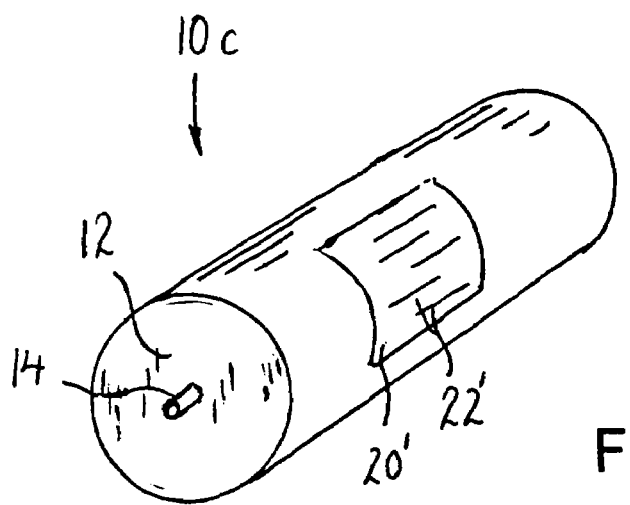
FIG. 5 is a perspective view of a yet different printing roller that can be used with the present invention.

As a still further modification, printing plate 18 can also be eliminated as well, as shown in printing roller 10c of FIG. 5, and cylindrical roller 12 is engraved at 22' in an area 20' thereon in order to produce an image during a printing operation.

Of course, there may be other variations of the above as well.

In accordance with the present invention, the cylindricity of printing roller 10 (cylindrical roller 12 and/or sleeve 16) and/or printing plate 18 is detected, that is, variations in TIR and/or TAPER are detected. Then, cylindrical roller 12, sleeve 16 and/or printing plate 18 are ablated by a laser to decrease variations in TIR and/or TAPER thereof in order to ensure cylindricity thereof.

Figure 6:
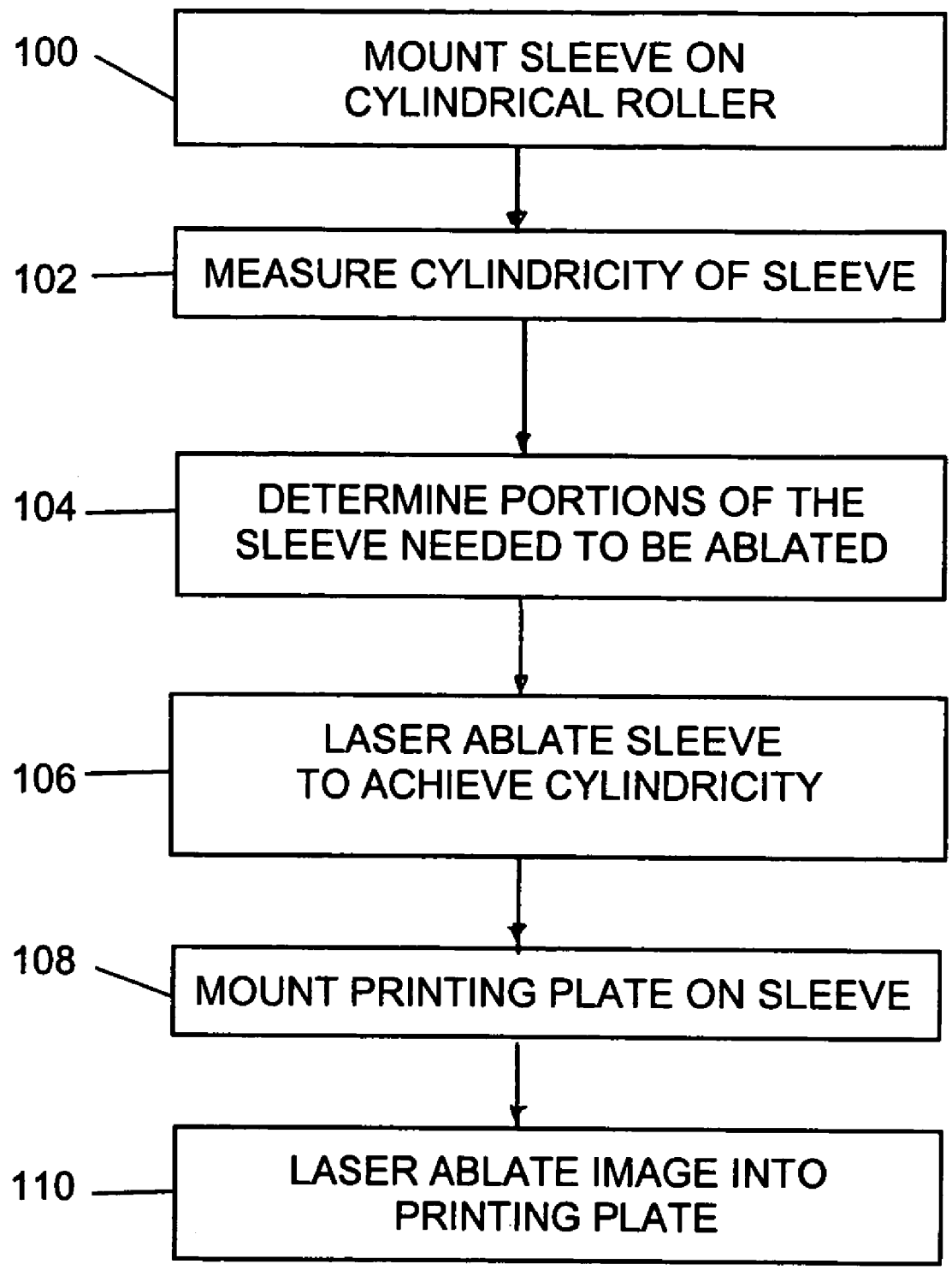
FIG. 6 is a flow chart diagram describing a first method according to the present invention.

According to a first method of the present invention, as shown in FIG. 6, and with relation to FIGS. 1-3, if printing plate 18 has a constant or uniform thickness throughout, it is only necessary to ablate sleeve 16 prior to mounting printing plate 18 thereon. In such case, sleeve 16 is mounted on cylindrical roller 12 in step 100. Sleeve 16 has an outer surface capable of ablation by a laser, or alternatively, sleeve 16 can have a coating on the outer surface thereof which is cable of ablation by a laser. Then, the cylindricity of sleeve 16 in regard to TIR and TAPER is measured in step 102. From these measurements, the portions of the outer surface of sleeve 16 that need to be ablated in order to reduce variations in TIR and/or TAPER and thereby enhance the cylindricity thereof, are determined in step 104. A laser then ablates those portions of the outer surface of sleeve 16 in order to reduce variations in TIR and/or TAPER, in step 106. In step 108, printing plate 18 is then mounted to the outer surface of sleeve 16 in a conventional manner. Because of the cylindricity of sleeve 16 and the substantially constant thickness of printing plate 18, the raised surface 20 of printing plate 18 has reduced variations in TIR and/or TAPER and thereby an enhanced cylindricity. In this first method, the outer surface of printing plate 18 can then also be ablated in accordance with the desired image, in step 110, as is well known, by using the same laser or by using a different laser.

Referring back to FIG. 1, an apparatus 8 for laser ablating sleeve 16 according to the first method in relation to the three embodiments of FIGS. 1-3, includes a laser 24, such as a $CO_2$ laser, a YAG laser or any other suitable laser, to ablate the outer surface of sleeve 16. Laser 24 is preferably mounted on a movable carriage 26 that can move along the lengthwise direction of printing roller 10 by means of a drive motor 28. Alternatively, as shown by dashed lines in FIG. 1, a drive motor 28' can be used to move printing roller 10 in the lengthwise direction thereof relative to laser 24 which is stationary. For example, a solenoid operated drive motor 28' can be used for such purpose. Still further, both drive motor 28 and drive motor 28' can be used in conjunction with each other. In other words, it is only important that there be relative lengthwise movement of laser 24 and printing roller 10 relative to each other. Alternatively, both printing roller 10 and laser 24 can be stationary, and laser 24 can be controlled to scan in the lengthwise direction of printing roller 10. If printing roller 10 is too long for such an operation, a plurality of lasers 24 can be mounted in spaced relation along the lengthwise direction of printing roller 10 for such scanning operation.

In order to control laser 24 to correctly ablate sleeve 16 to reduce variations in TIR and/or TAPER in order to ensure cylindricity, it is necessary to first measure any deviations or variations of TIR and/or and TAPER in regard to cylindricity.

In one embodiment, the same laser 24 can be used to detect any such deviation in cylindricity. In such case, laser 24 focuses a beam a light 30 that is bounced off the outer surface of sleeve 16 and received by a detector 32, such as an optical detector. Alternatively, detector 32 can provide its own source of light against sleeve 16, which is then bounced off the outer surface of sleeve 16 and received by detector 32. For example, detector 32 can include a conventional photodiode which directs light against sleeve 16, and a photodetector which detects the light reflected back therefrom. Generally, any signal waves in the electromagnetic spectrum can be used for such detection operation, which include, without limitation visible light rays, infrared rays, laser light, etc. A signal corresponding to this detection operation is then provided by detector 32 to a control device 34 which can be a computer programmed to control the ablation and relative movement of laser 24 and printing roller 10. Control device 34 controls drive motor 28 and/or drive motor 28' to control relative lengthwise movement of printing roller 10 and laser 24 during the measurement operation, and also controls a separate drive motor 36 to rotate cylindrical roller 12 by small increments. In this manner, the entire surface area of sleeve 16 is scanned. Alternatively, as discussed above, laser 24 can be stationary and carriage 26, drive motor 28 and drive motor 28' can be eliminated, and in such case, control device 34 would control stationary laser 24 to scan across printing roller 10 in the lengthwise direction thereof.

From these measurements, the portions of the outer surface of sleeve 16 that need to be ablated in order to reduce variations in TIR and/or TAPER to ensure cylindricity thereof are determined by control device 34. Laser 24 then ablates those portions of the outer surface of sleeve 16 in order to reduce variations in TIR and/or TAPER to ensure cylindricity thereof, while providing relative movement between printing roller 10 and laser 24. Thus, there is preferably relative longitudinal movement between sleeve 16 and laser 24, as well as rotation of sleeve 16 caused by drive motor 36. Once sleeve 16 is ablated in order to achieve cylindricity, printing plate 18 is then mounted to the outer surface of sleeve 16 in a conventional manner. The outer surface of printing plate 18 can then also be ablated in accordance with the desired image, by using the same laser 24.

In a modification thereof, a second scanning laser 24' can be provided for the ablation operation in addition to laser 24, in which case the latter laser 24 would be used only as a measuring laser.

As a modification thereof, the thickness of printing plate 18 can be detected while printing plate 18 is in a flat or planar condition, prior to being mounted on printing roller 10. In such case, a laser can be used for ablating the upper surface thereof to ensure that printing plate 18 has a substantially constant thickness throughout before being mounted onto sleeve 16.

As a further modification, the same laser 24 can be used to detect any such deviation in cylindricity by focusing a beam a light 30', as shown in FIG. 2, tangentially to the outer surface of sleeve 16 (or roller 12 or plate 18) and received by detector 32, such as an optical detector. Generally, any signal waves in the electromagnetic spectrum can be used for such detection operation, which include, without limitation visible light rays, infrared rays, laser light, etc. A signal corresponding to this detection operation is then provided by detector 32 to the same control device 34 in FIG. 1.

Figure 7:
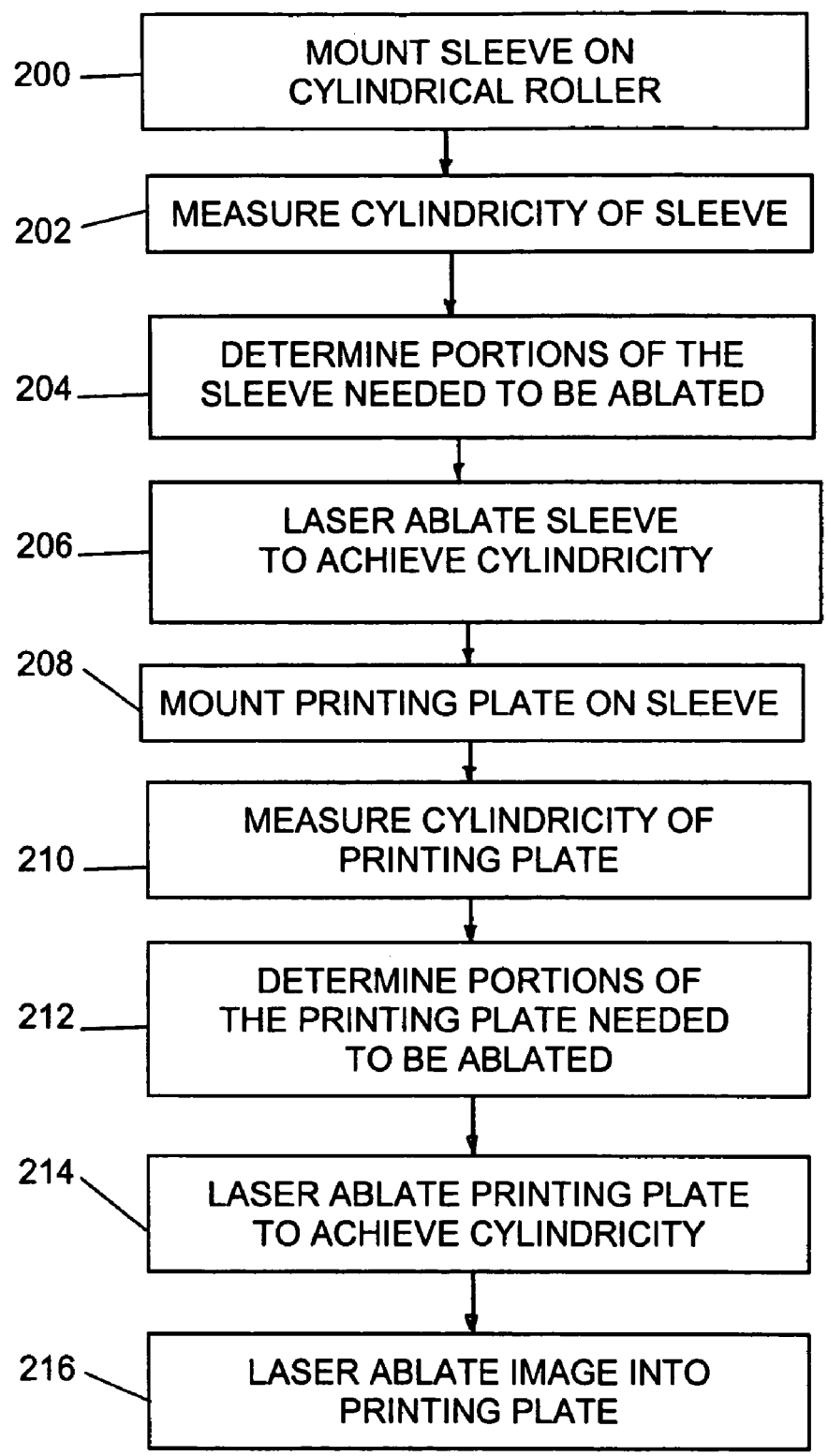
FIG. 7 is a flow chart diagram describing a second method according to the present invention.

In a second method of the present invention, and referring again to FIGS. 1-3, if printing plate 18 does not have a uniformly constant thickness throughout, then it is necessary to also ablate printing plate 18 to reduce variations in TIR and/or TAPER in order to ensure the cylindricity of the outer surface thereof when mounted on sleeve 16. Specifically, as shown in FIG. 7, sleeve 16 is mounted on cylindrical roller 12 in step 200. Then, the cylindricity of sleeve 16 in regard to variations in TIR and/or TAPER is measured in step 202 by detector 32. From these measurements, the portions of the outer surface of sleeve 16 that need to be ablated in order to reduce variations in TIR and/or TAPER to ensure cylindricity thereof are determined in step 204 by control device 34. Laser 24 then ablates those portions of the outer surface of sleeve 16 in order to reduce variations in TIR and/or TAPER to ensure cylindricity, in step 206. In step 206, there is preferably relative longitudinal movement between sleeve 16 and laser 24, as well as rotation of sleeve 16 caused by drive motor 36. In step 208, printing plate 18 is then mounted to the outer surface of sleeve 16 in a conventional manner. In step 210, the cylindricity of printing plate 18 in regard to variations in TIR and/or TAPER is measured by detector 32. From these measurements, the portions of the outer surface of printing plate 18 that need to be ablated to reduce variations in TIR and/or TAPER in order to ensure cylindricity thereof when mounted on sleeve 16, are determined in step 212, by control device 34. Laser 24 then ablates those portions of the outer surface of printing plate 18 in order to reduce variations in TIR and/or TAPER, in step 214. Because of the substantially perfect cylindricity of sleeve 16 and printing plate 18, the outer raised surface 20 of printing plate 18 has reduced variations in TIR and/or TAPER to ensure cylindricity thereof. In this second embodiment, the outer surface of printing plate 18 can then also be ablated in accordance with the desired image, in step 216, by using the same laser 24 or by using a different burning laser.

Further, steps 214 and 216 can be combined in a single step, that is, by a single step ablation by laser 24. Specifically, as a modification of the second embodiment, since information regarding the image to be produced by printing plate 18 can be stored in a memory of control device 34, it is possible for control device 34, when controlling laser 24 to ablate the outer surface of printing plate 18 to reduce variations in TIR and/or TAPER in order to ensure cylindricity, to simultaneously control laser 24 to ablate printing plate 18 to ablate or etch the printing image thereon. This can be accomplished by superimposing a signal corresponding to the deviations of TIR and/or TAPER onto the signal corresponding to the image to be produced, and supplying this superimposed signal to laser 24 for the ablation process. Thus, the cylindricity information would then be combined with information for the image to be engraved, and in such case, engraving laser 24, while engraving the image on printing plate 18, would also reduce variations in TIR and/or TAPER to enhance cylindricity thereof as it engraves the image.

In the above first and second methods, the steps relating to ablating of sleeve 16 would be applied directly to cylindrical roller 12 instead, where sleeve 16 is eliminated, and printing plate 18 is mounted directly on the outer surface of printing roller 12. In such case, it would be necessary to reduce variations in TIR and/or TAPER of cylindrical roller 12.

Figure 8:
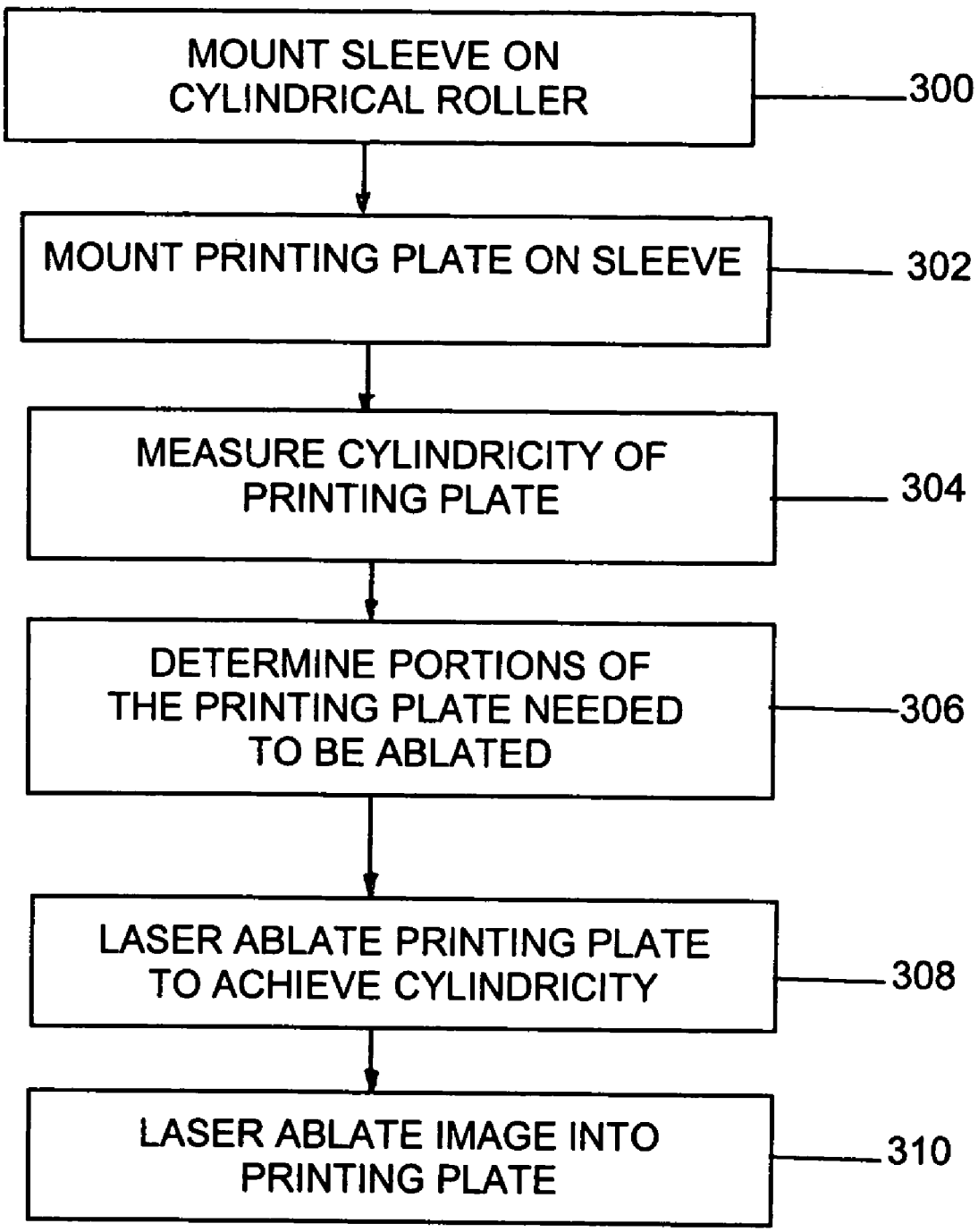
FIG. 8 is a flow chart diagram describing a third method according to the present invention.

Alternatively, in a third method of the present invention shown in FIG. 8, if the thickness of printing plate 18 is not uniformly constant throughout, it is possible to eliminate the steps relating to ablating of cylindrical roller 12 and sleeve 16, and in such case, only ablate printing plate 18 in order to reduce variations in TIR and/or TAPER to achieve cylindricity of the outer surface of printing plate 18 mounted on sleeve 16. Specifically, sleeve 16 is mounted on cylindrical roller 12 in step 300. In such case, cylindrical roller 12 and/or sleeve 16 may or may not have variations in TIR and/or TAPER, and may not be adequately cylindrical. Then, in step 302, printing plate 18 is mounted to the outer surface of sleeve 16 in a conventional manner. In step 304, the cylindricity of printing plate 18 in regard to TIR and/or TAPER is measured by detector 32. From these measurements, the portions of the raised or outer surface 20 of printing plate 18 that need to be ablated in order to reduce variations in TIR and/or TAPER in order to achieve cylindricity are determined in step 306 by control device 34. Laser 24 then ablates those portions of the outer surface of printing plate 18 in order to reduce variations in TIR and/or TAPER in order to achieve cylindricity, in step 308. In this manner, the raised surface 20 of printing plate 18 has reduced variations in TIR and/or TAPER to achieve cylindricity thereof. In this third embodiment, the outer surface of printing plate 18 can then also be ablated in accordance with the desired image, in step 310, by using the same laser 24 or by using a different laser 24'.

Further, steps 308 and 310 can be combined in a single step, that is, by a single step ablation by laser 24. This can be accomplished by superimposing a signal corresponding to the deviation of TIR and/or TAPER onto the signal corresponding to the image to be produced, and supplying this superimposed signal to laser 24 for the ablation process. Thus, the cylindricity information would then be combined with information for the image to be engraved, and in such case, engraving laser 24, while engraving the image on printing plate 18, would also reduce variations in TIR and/or TAPER to enhance cylindricity thereof as it engraves the image. In such case, the present invention provides a laser for both etching the image into a printing plate as well as ensuring that printing roller 10, and particularly, printing plate 18 thereon, has reduced variations in TIR and/or TAPER to achieve cylindricity thereof.

Figure 9:
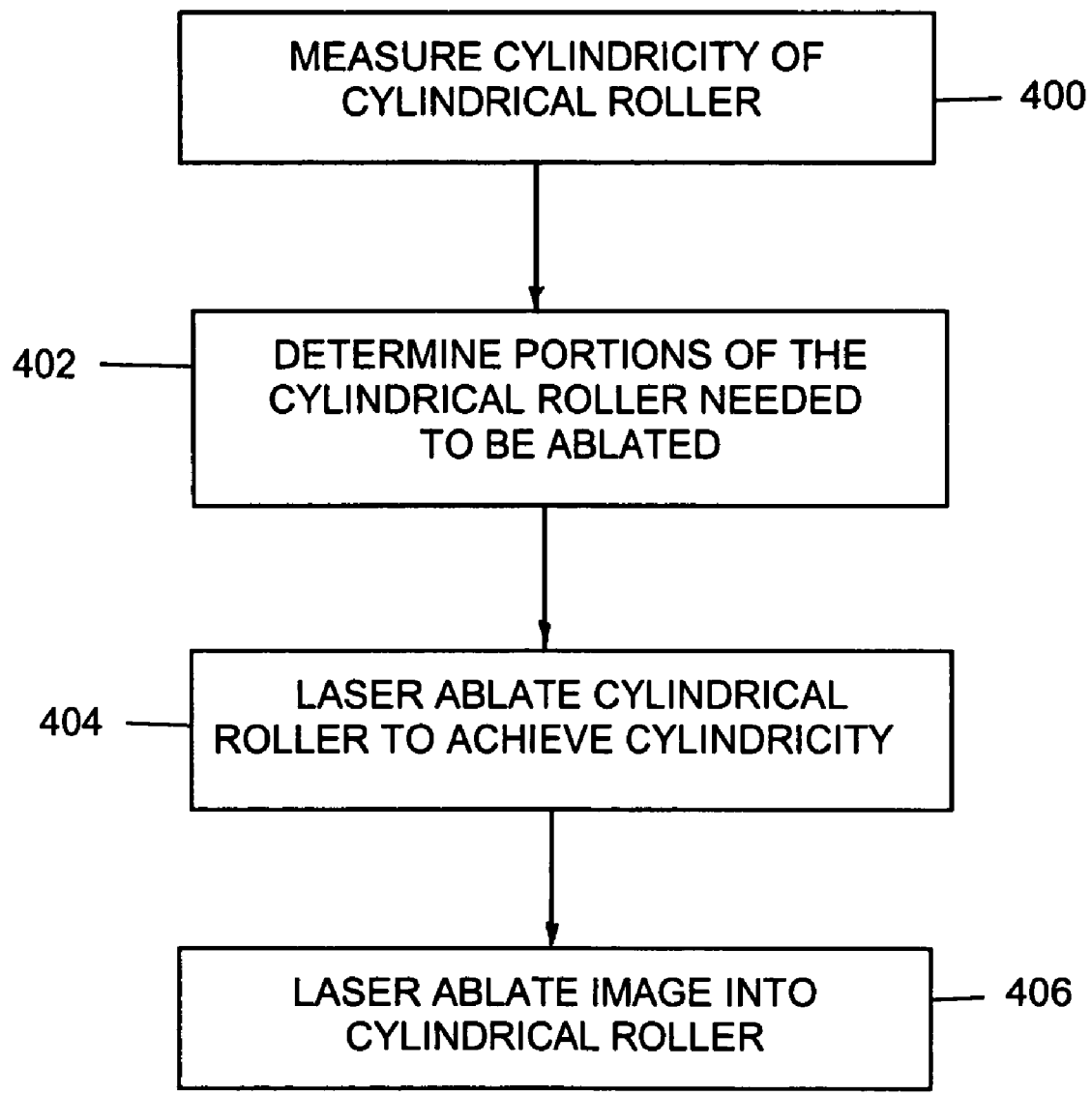
FIG. 9 is a flow chart diagram describing a fourth method according to the present invention.

The fourth method of the present invention shown in FIG. 9, is used in relation to printing roller 10c of FIG. 5 where printing plate 18 is eliminated and the image is directly engraved into an ablatable coating on cylindrical roller 12 (or sleeve 16), and where cylindrical roller 12 (or sleeve 16) has variations in TIR and/or TAPER, and may not be adequately cylindrical. Specifically, the cylindricity of cylindrical roller 12 (or sleeve 16) in regard to TIR and/or TAPER is measured in step 400 by detector 32. From these measurements, the portions of the outer surface of cylindrical roller 12 (or sleeve 16) that need to be ablated in order to reduce variations in TIR and/or TAPER to ensure cylindricity thereof are determined in step 402 by control device 34. Laser 24 then ablates those portions of the outer surface of cylindrical roller 12 (or sleeve 16) in order to reduce variations in TIR and/or TAPER to ensure cylindricity, in step 404. In step 404, there is preferably relative longitudinal movement between cylindrical roller 12 (or sleeve 16) and laser 24, as well as rotation of cylindrical roller 12 (or sleeve 16) caused by drive motor 36. The outer raised surface of cylindrical roller 12 (or sleeve 16) can then also be ablated in accordance with the desired image, in step 406, by using the same laser 24 or by using a different burning laser 24'. Further, steps 404 and 406 can be combined in a single step, that is, by a single step ablation by laser 24. This can be accomplished by superimposing a signal corresponding to the deviation of TIR and/or TAPER onto the signal corresponding to the image to be produced, and supplying this superimposed signal to laser 24 for the ablation process. Thus, the cylindricity information would then be combined with information for the image to be engraved, and in such case, engraving laser 24, while engraving the image on cylindrical roller 12 (or sleeve 16), would also reduce variations in TIR and/or TAPER to achieve cylindricity thereof. In such case, the present invention provides a laser for both etching the image into cylindrical roller 12 (or sleeve 16) as well as ensuring that cylindrical roller 12 (or sleeve 16) has reduced variations in TIR and/or TAPER to achieve cylindricity thereof.

It will be appreciated from the above that the present invention can use laser 24 to reduce variations in TIR and/or TAPER of cylindrical roller 12, sleeve 16 and/or printing plate 18, and if desired, also burn an image into cylindrical roller 12, sleeve 16 and/or printing plate 18 subsequent thereto or simultaneously therewith.

Having described specific preferred embodiments of the invention with reference to the accompanying drawings, it will be appreciated that the present invention is not limited to those precise embodiments and that various changes and modifications can be effected therein by one of ordinary skill in the art without departing from the scope or spirit of the invention as defined by the appended claims.

What is claimed is:

1. Apparatus for reducing variations in at least one of total indicated run-out and taper in a printing roller having an external surface with a radius, comprising:
    a detector which scans across and around at least a portion of the printing roller corresponding to where printing occurs and detects variations in the radius of the scanned portions of the printing roller during relative movement between the detector and the roller prior to any laser ablation of the surface of the printing roller in order to determine the radius at all scanned portions of the external surface of the printing roller and which produces an output corresponding thereto;
    a laser which ablates said surface of the printing roller; and
    a controller which, in response to the output from the detector:
      a) processes the output of the detector to determine different portions of the external surface of the printing roller to be ablated by said laser so as to reduce said at least one of total indicated run-out and taper of the printing roller,
      b) controls the position at which the printing roller is ablated, and
      c) controls the laser to ablate each portion of the printing roller that is determined to be ablated by said laser so as to reduce said at least one of total indicated run-out and taper of the printing roller.

2. Apparatus according to claim 1, wherein said detector includes a source of rays from the electromagnetic spectrum projected onto said surface and a sensor that detects said rays that are reflected off of said surface.

3. Apparatus according to claim 1, wherein said source of rays includes a laser.

4. Apparatus according to claim 1, further comprising a first driving device which rotates said printing roller to expose different portions of said surface to said detector and said laser.

5. Apparatus according to claim 4, further comprising a second driving device which provides relative movement in a lengthwise direction between said printing roller and at least one of said laser and said detector.

6. Apparatus according to claim 1, wherein said controller further controls said laser to etch an image into said cylindrical roller.

7. Apparatus according to claim 1, wherein said printing roller includes a cylindrical roller and a sleeve mounted on said cylindrical roller, and said controller controls said laser to reduce at least one of total indicated run-out and taper by ablating a surface of said sleeve.

8. Apparatus according to claim 1,
    further comprising a printing plate mounted on said printing roller; and
    wherein said control device controls said laser to reduce at least one of total indicated run-out and taper by further ablating a surface of said printing plate.

9. Apparatus according to claim 8, wherein said control device further controls said laser to etch an image into said printing plate.

10. Apparatus according to claim 6, wherein said controller further controls said laser to etch the image into said cylindrical roller simultaneously with ablation of each portion of the printing roller that is determined to be ablated by said laser so as to reduce said at least one of total indicated run-out and taper of the printing roller.

11. Apparatus according to claim 9, wherein said controller further controls said laser to etch the image into said printing plate simultaneously with ablation of said surface of said printing plate by said laser to reduce at least one of total indicated run-out and taper thereof.

12. Apparatus for reducing variations in at least one of total indicated run-out and taper in a printing plate having an external surface with a radius and mounted on a printing roller, comprising:
    a detector which scans across and around at least a portion of the printing plate and detects variations in the radius of said scanned portions of the printing plate during relative movement between the detector and the roller prior to any laser ablation of the surface of the printing plate in order to determine the radius at all scanned portions of the external surface of the printing plate and which produces an output corresponding thereto;
    a laser which ablates said surface of the printing plate; and
    a controller which, in response to the output from the detector:
      a) processes the output of the detector to determine different portions of the external surface of the printing plate to be ablated by said laser so as to reduce said at least one of total indicated run-out and taper of the printing plate,
      b) controls the position at which the printing plate is ablated, and
      c) controls the laser to ablate each portion of the printing plate that is determined to be ablated by said laser so as to reduce said at least one of total indicated run-out and taper of the printing plate.

13. Apparatus according to claim 12, wherein said detector includes a source of rays from the electromagnetic spectrum projected onto said exposed surface and a sensor that detects said rays that are reflected off of said exposed surface.

14. Apparatus according to claim 12, wherein said source of rays includes a laser.

15. Apparatus according to claim 12, further comprising a first driving device which rotates said printing roller to expose different portions of said surface to said detector and said laser.

16. Apparatus according to claim 15, further comprising a second driving device which provides relative movement in a lengthwise direction between said printing roller and at least one of said laser and said detector.

17. Apparatus according to claim 12, wherein said control device further controls said laser to etch an image into said printing plate.

18. Apparatus according to claim 17, wherein said controller further controls said laser to etch the image into said printing plate simultaneously with ablation of said surface of said printing plate by said laser to reduce at least one of total indicated run-out and taper thereof.

19. A method for reducing variations in at least one of total indicated run-out and taper in a printing roller having an external surface with a radius, comprising the steps of:
scanning across and around at least a portion of the printing roller corresponding to where printing occurs;
detecting variations in the radius of said scanned portions of the printing roller during relative movement between the detector and the roller prior to any laser ablation of the surface of the printing roller in order to determine the radius at all scanned portions of the external surface of the printing roller and producing an output corresponding thereto;
processing the output of the detector to determine different portions of the external surface of the printing roller to be ablated by said laser so as to reduce said at least one of total indicated run-out and taper of the printing roller;
controlling the position at which the printing roller is ablated; and
controlling the laser to ablate each portion of the printing roller that is determined to be ablated by said laser so as
to reduce said at least one of total indicated run-out and taper thereof.

20. A method according to claim 19, wherein said step of detecting includes the step of projecting a source of rays from the electromagnetic spectrum onto said surface and a sensor that detects said rays that are reflected off of said surface.

21. A method according to claim 19, wherein said source of rays includes a laser.

22. A method according to claim 19, further comprising the step of rotating said printing roller to expose different portions of said surface during said steps of detecting and laser ablating.

23. A method according to claim 22, further comprising the step of providing relative movement in a lengthwise direction between said printing roller and at least one of said laser and said detector.

24. A method according to claim 19, further comprising the step of laser ablating an image into said cylindrical roller.

25. A method according to claim 19, wherein said printing roller includes a cylindrical roller and a sleeve mounted on said cylindrical roller, and said step of laser ablating includes the step of reducing at least one of total indicated run-out and taper by ablating a surface of said sleeve.

26. A method according to claim 19, further comprising a printing plate mounted on said printing roller; and further comprising the step of reducing at least one of total indicated run-out and taper by further ablating a surface of said printing plate.

27. A method according to claim 26, further comprising the step of laser ablating an image into said printing plate.

28. A method according to claim 24, wherein said step of laser ablating an image into said cylindrical roller occurs simultaneously with ablation of each portion of the printing roller that is determined to be ablated by said laser so as to reduce said at least one of total indicated run-out and taper of the printing roller.

29. A method according to claim 27, wherein said step of laser ablating an image into said printing plate occurs simultaneously with said step of reducing at least one of total indicated run-out and taper by further ablating a surface of said printing plate.

30. A method for reducing variations in at least one of total indicated run-out and taper in a printing plate having an external surface with a radius and mounted on a printing roller, comprising the steps of:
scanning across and around at least a portion of the printing plate;
detecting variations in the radius of said scanned portions of the printing plate during relative movement between the detector and the roller prior to any laser ablation of the surface of the printing plate in order to determine the radius at all scanned portions of the entire external surface of the printing plate and producing an output corresponding thereto;
processing the output of the detector to determine different portions of the external surface of the printing plate to be ablated by said laser so as to reduce said at least one of total indicated run-out and taper of the printing plate;
controlling the position at which the printing plate is ablated; and
controlling the laser to ablate each portion of the printing plate that is determined to be ablated by said laser so as to reduce said at least one of total indicated run-out and taper thereof.

31. A method according to claim 30, wherein step of detecting includes the step of projecting a source of rays from the electromagnetic spectrum onto said surface and a sensor that detects said rays that are reflected off of said surface.

32. A method according to claim 31, wherein said source of rays includes a laser.

33. A method according to claim 30, further comprising the step of rotating said printing roller to expose different portions of said surface during said steps of detecting and laser ablating.

34. A method according to claim 33, further comprising the step of providing relative movement in a lengthwise direction between said printing plate and at least one of said laser and said detector.

35. A method according to claim 30, further comprising the step of laser ablating an image into said printing plate.

36. A method according to claim 35, wherein said steps of laser ablating said different portions and laser ablating an image are simultaneously performed.

37. Apparatus for reducing variations in at least one of total indicated run-out and taper in at least one of a printing roller, a sleeve and a printing plate, comprising:
a detector which scans across and around at least a portion of at least one of the printing roller, the sleeve and the printing plate corresponding to where printing occurs and which detects variations in a radius of said scanned portions of the at least one of a printing roller, a sleeve and a printing plate during relative movement between the detector and the at least one of a printing roller, a sleeve and a printing plate prior to any laser ablation of the surface thereof in order to determine the radius at all scanned portions of the external surface of the at least one of a printing roller, a sleeve and a printing plate and which produces an output corresponding thereto;
a laser which ablates said surface; and
a controller which, in response to the output from the detector:
a) processes the output of the detector corresponding to said variations in the surface of at least one of the printing roller, the sleeve and the printing plate to determine different portions of the external surface of at least one of the printing roller, the sleeve and the printing plate to be ablated by said laser so as to reduce detected variations in at least one of total indicated run-out and taper in at least one of the printing roller, the sleeve and the printing plate, b) controls the position at which at least one of the printing roller, the sleeve and the printing plate is ablated, and c) controls the laser to ablate each portion of the at least one of the printing roller, the sleeve and the printing plate that is determined to be ablated by said laser so as to reduce said at least one of total indicated run-out and taper of the printing roller to ablate said surface in a manner to reduce the detected variations in at least one of total indicated run-out and taper in the printing roller.

38. A method for reducing variations in at least one of total indicated run-out and taper in a at least one of a printing roller, a sleeve and a printing plate, comprising the steps of:

scanning across and around at least a portion of at least one of the printing roller, the sleeve and the printing plate corresponding to where printing occurs;

detecting variations in a radius of said scanned portions of at least one of a printing roller, a sleeve and a printing plate with a detector during relative movement between the detector and the at least one of a printing roller, a sleeve and a printing plate prior to any laser ablation of the surface thereof in order to determine the radius at all scanned portions of the external surface of the at least one of a printing roller, a sleeve and a printing plate and producing an output corresponding thereto;

processing said output of the detector corresponding to said variations in the surface of at least one of the printing roller, the sleeve and the printing plate to determine different portions of the external surface of said at least one of a printing roller, a sleeve and a printing plate to be ablated by said laser so as to reduce the detected variations;

controlling the position at which at least one of the printing roller, the sleeve and the printing plate is ablated;

controlling the laser to ablate each portion of the at least one of the printing roller, the sleeve and the printing plate that is determined to be ablated by said laser to reduce the detected variations.

39. An apparatus for improving the cylindricity of a printing roller having an external surface with a radius, the apparatus comprising:

a detector which scans across and around at least a portion of the printing roller corresponding to where printing occurs and measures variations in the radius of said scanned portions of the printing roller during relative movement between the detector and the roller prior to any laser ablation of the surface of the printing roller in order to determine the radius at all scanned portions of the external surface of the printing roller and which produces an output corresponding thereto;

a laser to ablate said surface; and a controller which, in response to the output from the detector:

a) processes the output of the detector to determine different portions of the external surface of the printing roller to be ablated by said laser so as to reduce said measured variations in the surface, b) controls the position at which the printing roller is ablated, and c) controls the laser to ablate each portion of the printing roller that is determined to be ablated by said laser so as to reduce said measured variations in the surface of the printing roller.

40. The apparatus as set forth in claim 39 wherein the variations in the surface are determined by the detector measuring at least one of total indicated run-out and taper of the surface on the printing roller.

41. The apparatus as set forth in claim 40 wherein relative movement is controlled between the detector and the printing roller.

42. The apparatus as set forth in claim 40 wherein the detector is controlled to measure at least one of total indicated run-out and taper of the surface on the printing roller.

43. The apparatus as set forth in claim 40 wherein the laser ablates an image onto the surface on the printing roller.

44. Apparatus according to claim 43, wherein said controller further controls said laser to etch the image into said cylindrical roller simultaneously with ablation of each portion of the printing roller that is determined to be ablated by said laser so as to reduce said measured variations in the surface of the printing roller.

45. A printing roller having an external surface with a radius and having an improved cylindricity constructed by the method according to the steps of:

scanning across and around at least a portion of the printing roller corresponding to where printing occurs;

measuring variations in the radius of said scanned portions of the printing roller with a detector during relative movement between the detector and the roller prior to any laser ablation of the surface of the printing roller in order to determine the radius at all scanned portions of the external surface of the printing roller and producing an output corresponding thereto;

processing the output of the detector to determine different portions of the external surface of the printing roller to be ablated by said laser so as to improve the cylindricity of the printing roller;

controlling the position at which the printing roller is ablated; and controlling the laser to ablate each portion of said external surface of said printing roller that is determined to be ablated by said laser according to the measured variations in the surface to improve the cylindricity of the printing roller.

46. The printing roller having an improved cylindricity constructed as set forth in claim 45 wherein said step of measuring variations includes the step of measuring at least one of total indicated run-out and taper of the surface on the printing roller.

47. The printing roller having an improved cylindricity constructed as set forth in claim 46 further including the step of controlling relative movement between the detector and the printing roller.

48. The printing roller having an improved cylindricity constructed as set forth in claim 46 further including the step of controlling the detector to measure at least one of total indicated run-out and taper of the surface on the printing roller.

49. The printing roller having an improved cylindricity constructed as set forth in claim 46 further including the step of ablating an image onto the surface on the printing roller with the laser.

* * * * *